US009334158B2

(12) United States Patent
Huang et al.

(10) Patent No.: US 9,334,158 B2
(45) Date of Patent: May 10, 2016

(54) CHIP PACKAGE AND METHOD FOR FORMING THE SAME

(71) Applicant: XINTEC INC., Jhongli, Taoyuan County (TW)

(72) Inventors: Yu-Ting Huang, Tainan (TW); Shu-Ming Chang, New Taipei (TW); Yen-Shih Ho, Kaohsiung (TW); Tsang-Yu Liu, Zhubei (TW)

(73) Assignee: XINTEC INC., Taoyuan (TW)

( * ) Notice: Subject to any disclaimer, the term of this patent is extended or adjusted under 35 U.S.C. 154(b) by 110 days.

(21) Appl. No.: 13/900,081

(22) Filed: May 22, 2013

(65) Prior Publication Data

US 2013/0320559 A1 Dec. 5, 2013

Related U.S. Application Data

(60) Provisional application No. 61/650,126, filed on May 22, 2012.

(51) Int. Cl.
*H01L 23/48* (2006.01)
*B81B 7/00* (2006.01)
*H01L 21/64* (2006.01)
(Continued)

(52) U.S. Cl.
CPC .............. *B81B 7/0077* (2013.01); *B81B 7/007* (2013.01); *B81B 2207/095* (2013.01); *B81B 2207/096* (2013.01); *H01L 21/64* (2013.01); *H01L 23/481* (2013.01); *H01L 23/498* (2013.01); *H01L 23/525* (2013.01); *H01L 24/02* (2013.01); *H01L 24/05* (2013.01); *H01L 24/06* (2013.01); *H01L 24/13* (2013.01); *H01L 2221/68327* (2013.01); *H01L 2221/68381* (2013.01); *H01L 2224/02311* (2013.01); *H01L 2224/02331* (2013.01); *H01L 2224/02372* (2013.01); *H01L 2224/0401* (2013.01); *H01L 2224/05548* (2013.01); *H01L 2224/06182* (2013.01);
(Continued)

(58) Field of Classification Search
CPC .................... B81B 2207/09; B81B 2207/091; B81B 2207/094; B81B 2207/096
USPC ....................................................... 257/777
See application file for complete search history.

(56) References Cited

U.S. PATENT DOCUMENTS

2006/0175707 A1* 8/2006 Lee et al. ........................ 257/767
2008/0099862 A1* 5/2008 Fujii et al. ...................... 257/417
2010/0155865 A1* 6/2010 Sugiura et al. ................. 257/417

FOREIGN PATENT DOCUMENTS

TW 201203479 1/2012

*Primary Examiner* — William Harriston
(74) *Attorney, Agent, or Firm* — Liu & Liu

(57) ABSTRACT

An embodiment of the invention provides a chip package including: a first semiconductor substrate; a second semiconductor substrate disposed on the first semiconductor substrate, wherein the second semiconductor substrate includes a lower semiconductor layer, an upper semiconductor layer, and an insulating layer located between the lower semiconductor layer and the upper semiconductor layer, and a portion of the lower semiconductor layer electrically contacts with at least a pad on the first semiconductor substrate; a signal conducting structure disposed on a lower surface of the first semiconductor substrate, wherein the signal conducting structure is electrically connected to a signal pad on the first semiconductor substrate; and a conducting layer disposed on the upper semiconductor layer of the second semiconductor substrate and electrically contacted with the portion of the lower semiconductor layer electrically contacting with the at least one pad on the first semiconductor substrate.

20 Claims, 7 Drawing Sheets

(51) Int. Cl.
*H01L 23/498* (2006.01)
*H01L 23/525* (2006.01)
*H01L 23/00* (2006.01)

(52) U.S. Cl.
CPC ............ *H01L 2224/131* (2013.01); *H01L 2224/13024* (2013.01); *H01L 2924/13091* (2013.01); *H01L 2924/1461* (2013.01)

CHIP PACKAGE AND METHOD FOR FORMING THE SAME

CROSS REFERENCE TO RELATED APPLICATIONS

This application claims the benefit of U.S. Provisional Application No. 61/650,126, filed on May 22, 2012, the entirety of which is incorporated by reference herein.

BACKGROUND OF THE INVENTION

1. Field of the Invention

The present invention relates to a chip package, and in particular, relates to a micro-electro mechanical system (MEMS) chip package.

2. Description of the Related Art

Along with the trends toward lighter, thinner, shorter, and smaller electronic devices, semiconductor chip package structures accordingly tend to be multi-chip package (MCP) structures which are multi-functional and have high performance. Multi-chip package (MCP) structures integrate a variety of semiconductor chips, such as logic chips, analog chips, control chips, memory chips, or micro-electro mechanical system (MEMS) chips, in a single package.

As the density of devices increases, the density of conductive bumps on the bottoms of chip packages increases as well. New methods for the disposition of the needed conductive bumps in a limited space have become important issues.

BRIEF SUMMARY OF THE INVENTION

An embodiment of the invention provides a chip package, which includes: a first semiconductor substrate; a second semiconductor substrate disposed on the first semiconductor substrate, wherein the second semiconductor substrate comprises a lower semiconductor layer, an upper semiconductor layer, and an insulating layer therebetween, and a portion of the lower semiconductor layer electrically contacts with at least one pad on the first semiconductor substrate; a signal conducting structure disposed on a lower surface of the first semiconductor substrate, wherein the signal conducting structure is electrically connected to a signal pad on the first semiconductor substrate; and a conducting layer disposed on the upper semiconductor layer of the second semiconductor substrate and electrically connected to the portion of the lower semiconductor layer electrically contacting with the at least one pad on the first semiconductor substrate.

An embodiment of the invention provides a method for forming a chip package, which includes: providing a first semiconductor substrate; providing a second semiconductor substrate comprising a lower semiconductor layer, an upper semiconductor layer, and an insulating layer therebetween; bonding the second semiconductor substrate onto the first semiconductor substrate such that a portion of the lower semiconductor layer electrically contacts with at least one pad on the first semiconductor substrate; forming a conducting layer on the upper semiconductor layer of the second semiconductor substrate, wherein the conducting layer is electrically connected to the portion of the lower semiconductor layer electrically contacting with the at least one pad on the first semiconductor substrate; and forming a signal conducting structure on a lower surface of the first semiconductor substrate, wherein the signal conducting structure is electrically connected to a signal pad on the first semiconductor substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The manufacturing method and method for use of the embodiment of the invention are illustrated in detail as followed. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first material layer "on," or "overlying" a second material layer, include embodiments where the first and second material layers are in direct contact and those where one or more material layers are interposing the first and second material layers.

A chip package according to an embodiment of the present invention may be used to package various chips. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power metal oxide semiconductor field effect transistor (MOSFET) modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits. In one embodiment, after the dicing process is performed, the obtained chip package is a chip scale package (CSP). The size of the chip scale package (CSP) may be only slightly larger than the size of the packaged chip. For example, the size of the chip scale package is not larger than 120% of the size of the packaged chip.

Figure 1A:
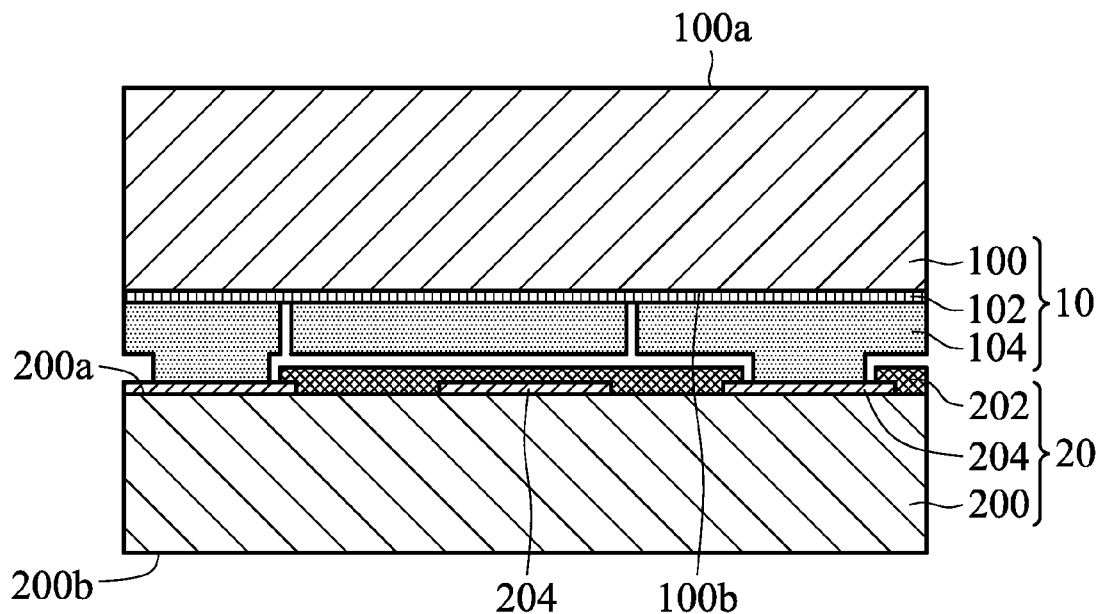
FIGS. 1A-1J are cross-sectional views of a manufacturing process of a chip package according to an embodiment of the present invention.

FIGS. 1A-1J are cross-sectional views of a manufacturing process of a chip package according to an embodiment of the present invention. As shown in FIG. 1A, semiconductor substrates 10 and 20 are provided. In one embodiment, the semiconductor substrates 10 and 20 are both semiconductor wafers, wherein the semiconductor wafers are, for example, but are not limited to, a wafer with micro-electro mechanical systems (MEMS) and a wafer with complementary metal-oxide-semiconductor field effect transistors.

In one embodiment, the semiconductor substrate 10 includes a lower semiconductor layer 104, an upper semiconductor layer 100 and an insulating layer 102 located between the lower semiconductor layer 104 and the upper semiconductor layer 100. The upper semiconductor layer 100 may have a surface 100a and a surface 100b, wherein the insulating layer 102 under the surface 100b may electrically insulate the upper semiconductor layer 100 from the lower semiconductor layer 104. In one embodiment, a plurality of gaps may be defined in the lower semiconductor layer 104, wherein the gaps divide the lower semiconductor layer 104 into a plurality of portions separated from each other.

In one embodiment, the semiconductor substrate 20, such as a semiconductor wafer, includes a semiconductor substrate 200, pads 204 disposed on a surface 200a of the semiconductor substrate 200 and a dielectric layer 202 disposed on the surface 200a. The pads 204 may include a signal pad or a grounding pad.

In one embodiment, the semiconductor substrate 10 may be bonded onto the semiconductor substrate 20 such that a portion of the lower semiconductor layer 104 is bonded to and electrically contacts with at least one of the pads 204. In one embodiment, the pads 204 contacting the portion of the lower semiconductor layer 104 may be, but are not limited to, grounding pads.

Figure 1B:
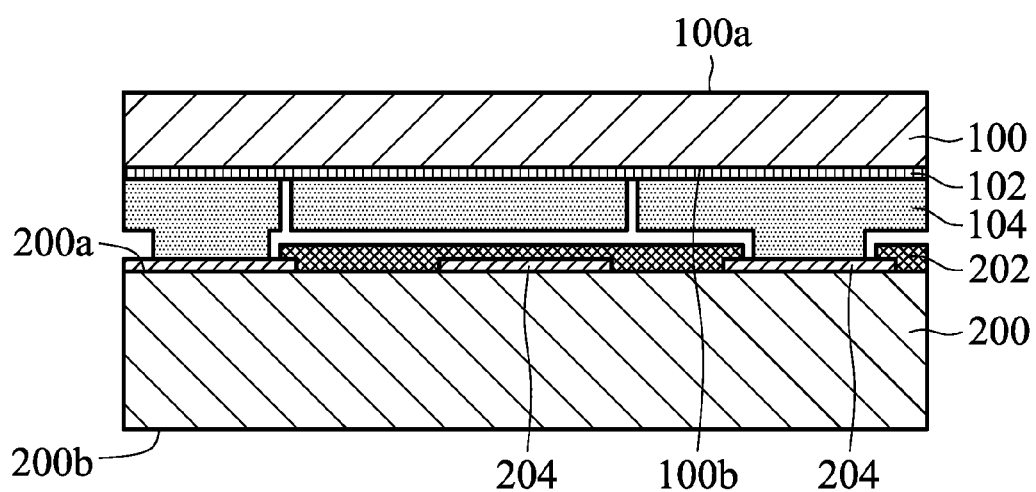

Then, as shown in FIG. 1B, the upper semiconductor layer 100 may be optionally thinned. A suitable thinning process includes, for example, a mechanical polishing process, a chemical mechanical polishing process, an etching process or combinations thereof.

Then, a conducting layer may be formed on the surface 100a of the upper semiconductor layer 100, wherein the conducting layer is electrically connected to the portion of the lower semiconductor layer 104 and the pads 204, such as grounding pads. The conducting layer may be electrically connected to the pads 204 via through holes and/or sidewalls of the semiconductor substrate. Note that for the sake of simplicity, the conducting layer in the embodiments described below is electrically connected to the pads 204 (such as grounding pads) via through holes.

Figure 1C:
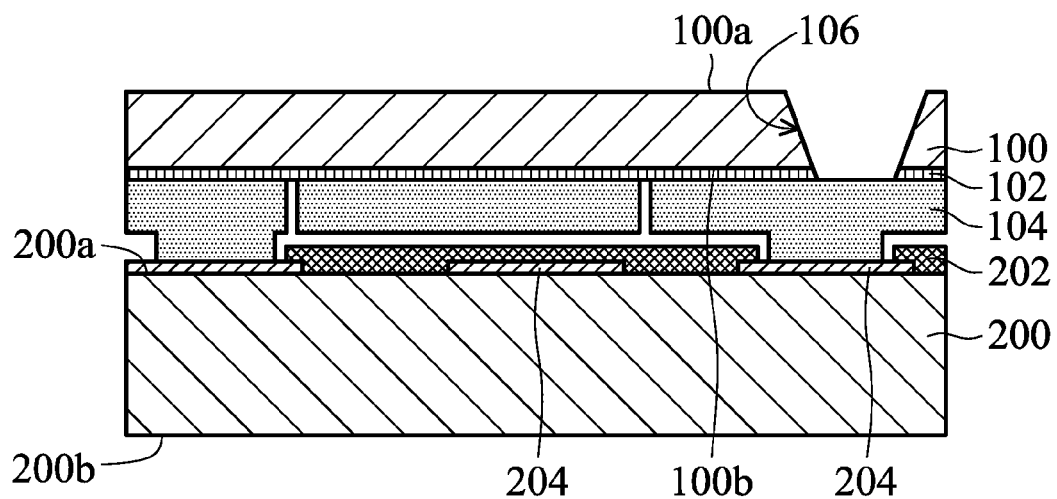

As shown in FIG. 1C, a portion of the upper semiconductor layer 100 is removed from the surface 100a of the upper semiconductor layer 100 to form a hole 106 extending toward the lower semiconductor layer 104. In one embodiment, the hole 106 may be aligned with the pad 204 (such as a grounding pad) and the portion of the lower semiconductor layer 104 connecting the pad 204. In another embodiment, the hole 106 may be aligned with the pad 204, but the pad 204 aligned with the hole 106 may not contact with the lower semiconductor layer 104. In the other embodiments, the hole 106 is not aligned with the pad 204.

Figure 1D:
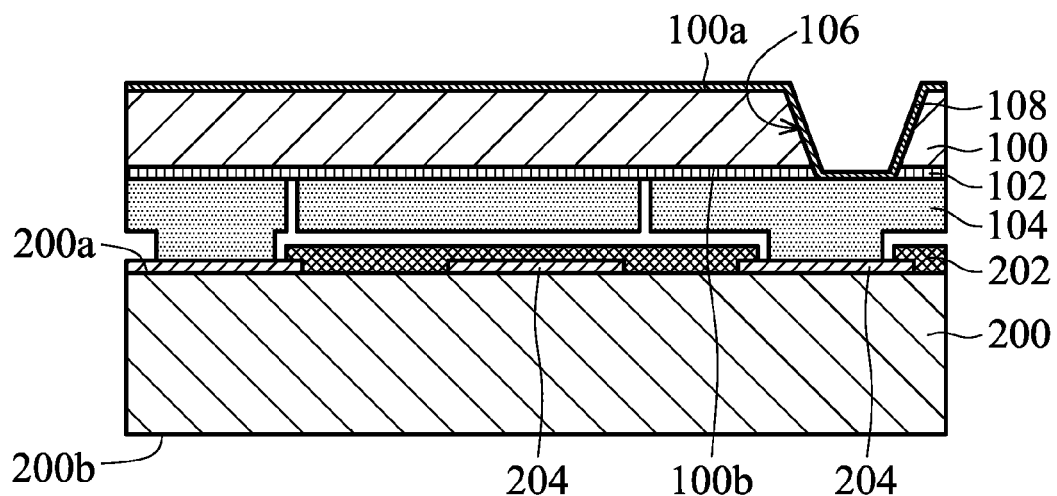

Then, as shown in FIG. 1D, a conducting layer 108 may be formed on the surface 100a of the upper semiconductor layer 100. In one embodiment, the conducting layer 108 may extend into the hole 106 to electrically contact the exposed lower semiconductor layer 104. The lower semiconductor layer 104 exposed by the hole 106 may be electrically connected to the pad 204 (such as a grounding pad) on the semiconductor substrate 200. Thus, the conducting layer 108 may be electrically connected to the pad 204 for grounding applications. In one embodiment, the conducting layer 108 may cover (almost) the entire surface 100a of the upper semiconductor layer 100 and the sidewall and the bottom of the hole 106. In one embodiment, the conducting layer 108 may directly contact with the upper semiconductor layer 100. In one embodiment, the hole 106 may be located on a predetermined scribing line (not shown).

Furthermore, in other embodiments, in addition to grounding applications, the conducting layer 108 may be used as an electromagnetic interference shielding (EMI shielding) layer, a thermal conducting layer or a reflective layer.

Figure 1E:
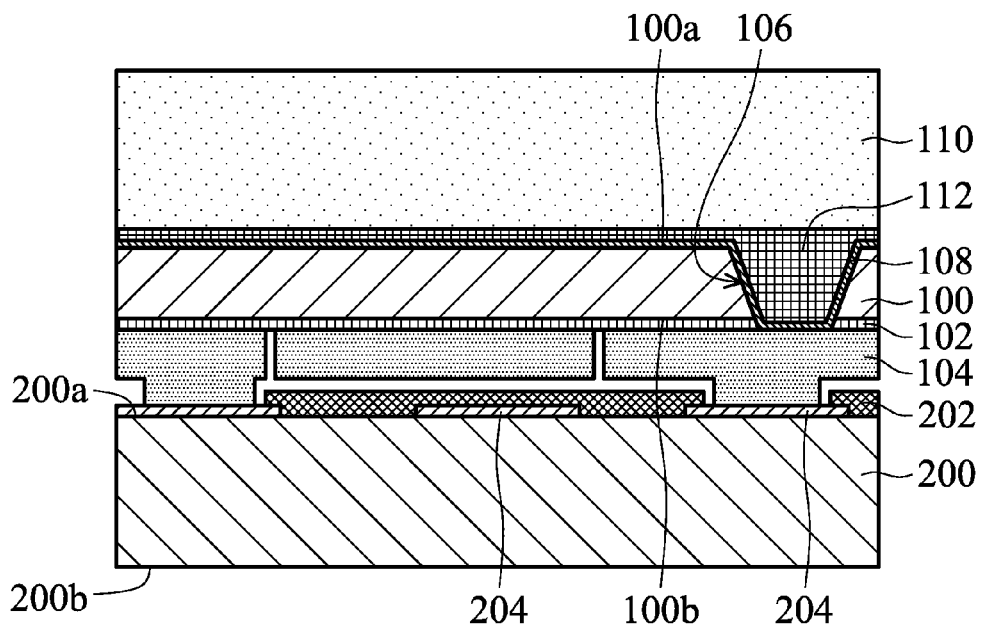

As shown in FIG. 1E, a carrier substrate 110 may be optionally disposed on the upper semiconductor layer 100. For example, an adhesive layer 112 may be adopted to bond the carrier substrate 110 onto the upper semiconductor layer 100.

Figure 1F:
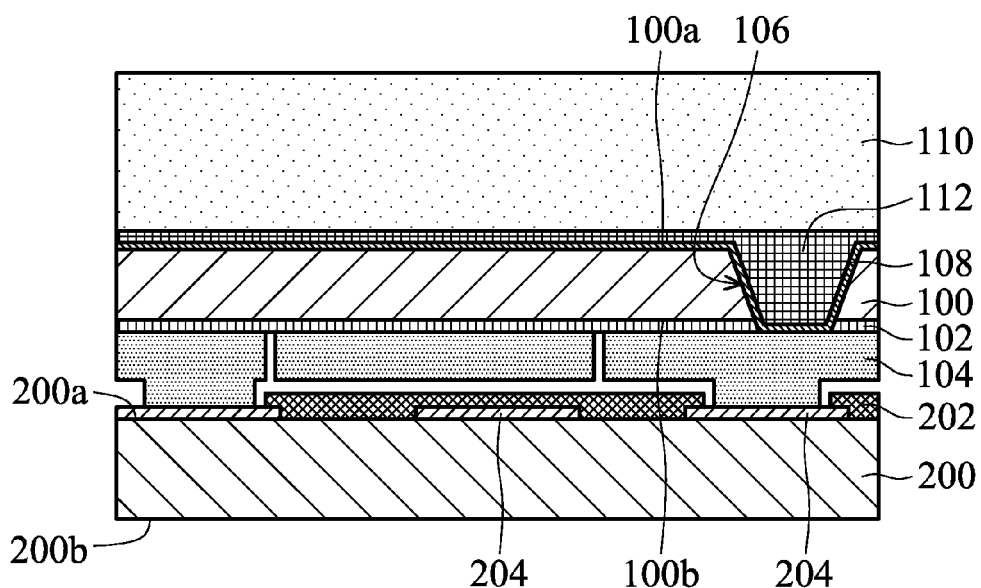

Then, as shown in FIG. 1F, the semiconductor substrate 200 may be optionally thinned. For example, the semiconductor substrate 200 may be thinned from the surface 200b of the semiconductor substrate 200 by using the carrier substrate 110 as a support.

Figure 1G:
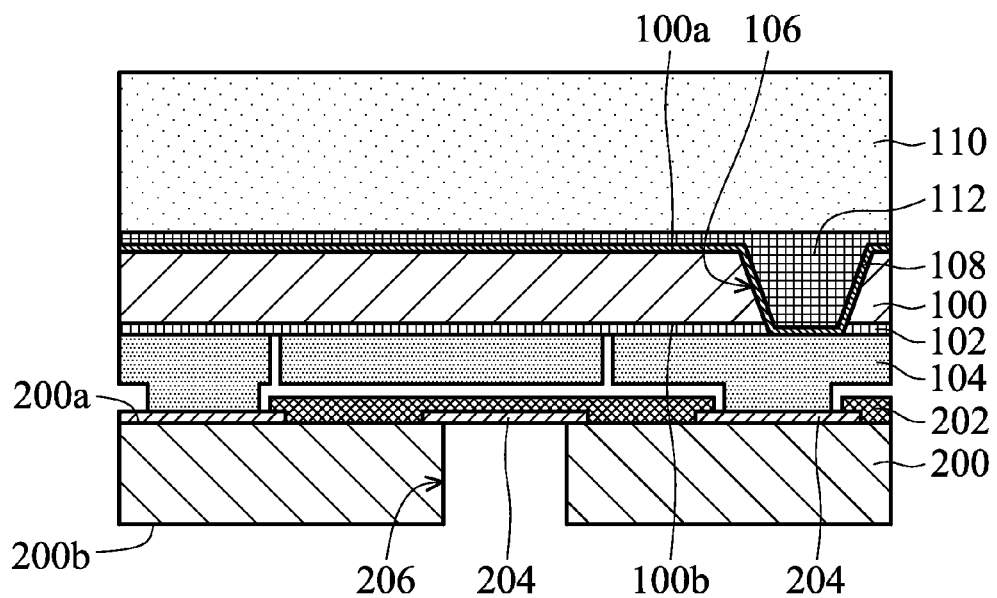

As shown in FIG. 1G, a portion of the semiconductor substrate 200 may be removed from the surface 200b to form a hole 206 extending toward the pad 204, such as a signal pad.

Figure 1H:
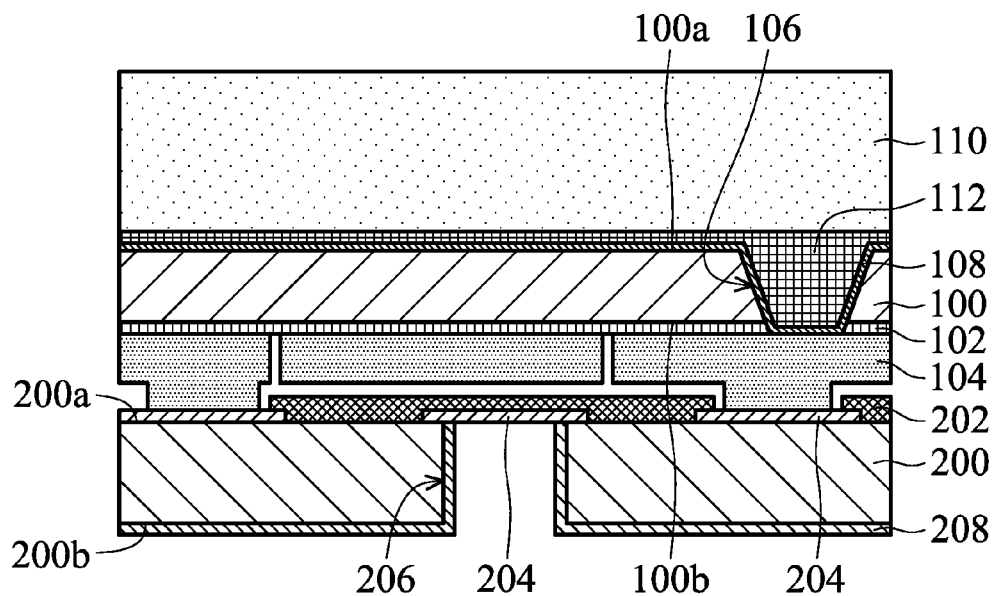

Then, as shown in FIG. 1H, an insulating layer 208 may be formed on the surface 200b of the semiconductor substrate 200. The insulating layer 208 may extend onto the sidewall and the bottom of the hole 206. In one embodiment, the insulating layer 208 located on the bottom of the hole 206 may be removed by a patterning process to expose the pad 204 (e.g. a signal pad).

Figure 1I:
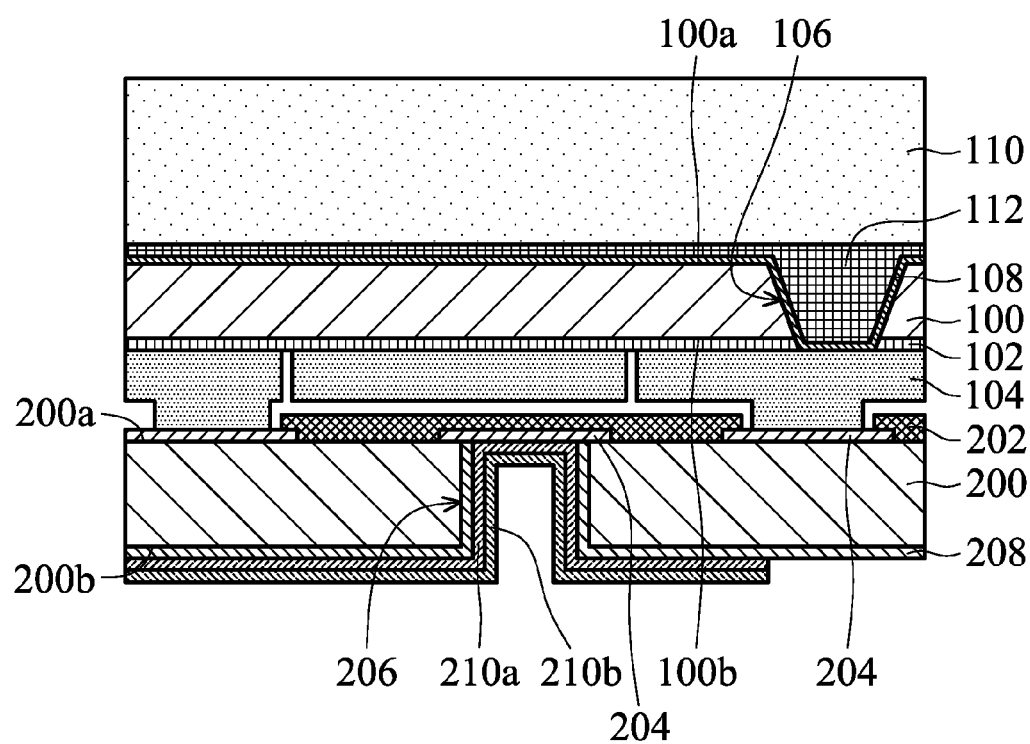

As shown in FIG. 1I, a conducting layer electrically connected to the pad 204 (e.g. a signal pad) is then formed on the insulating layer 208. For example, a seed layer 210a may be formed, and then a conducting layer 210b is formed by an electroplating process.

Figure 1J:
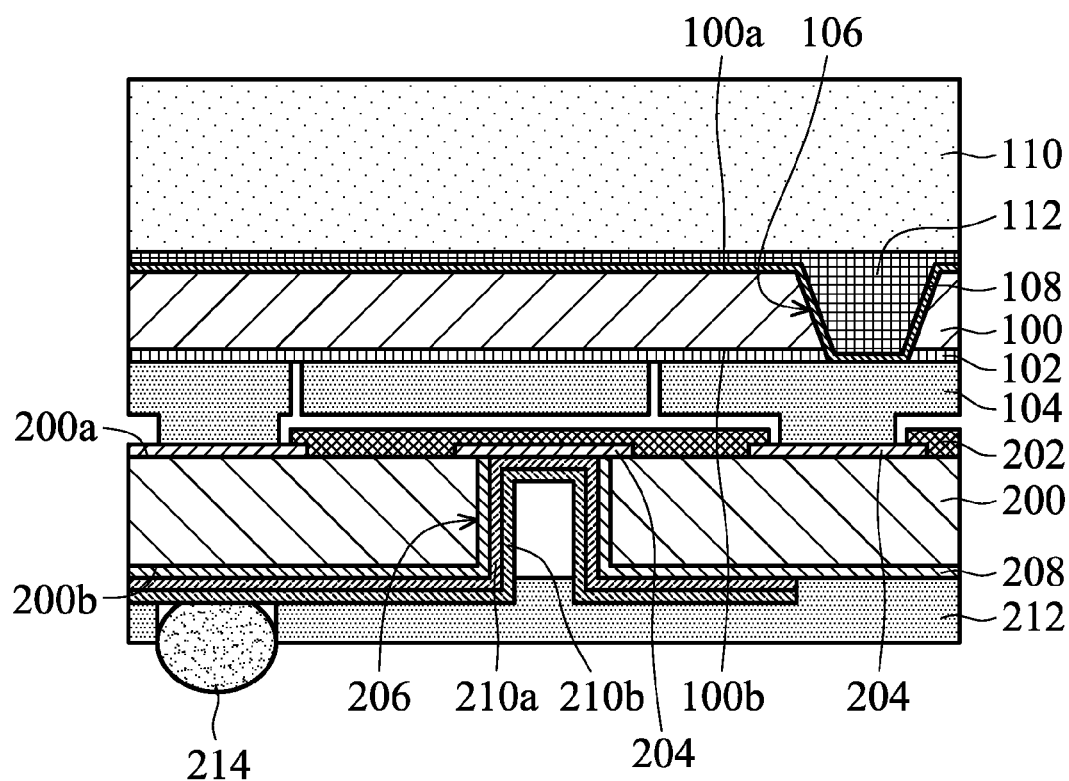

Then, as shown in FIG. 1J, a protection layer 212 may be formed on the conducting layer 210b and the insulating layer 208, and the protection layer 212 has at least one opening exposing a portion of the conducting layer 210b. Then, a signal conducting structure 214 may be formed in the opening, wherein the signal conducting structure 214 is, for example, a conductive bump or a solder ball. In the embodiment where the two semiconductor substrates bonded to each other are two semiconductor wafers, a cutting process is performed along the predetermined scribing line (not shown) to cut the two semiconductor substrates into a plurality of chip packages separated from each other.

Figure 2:
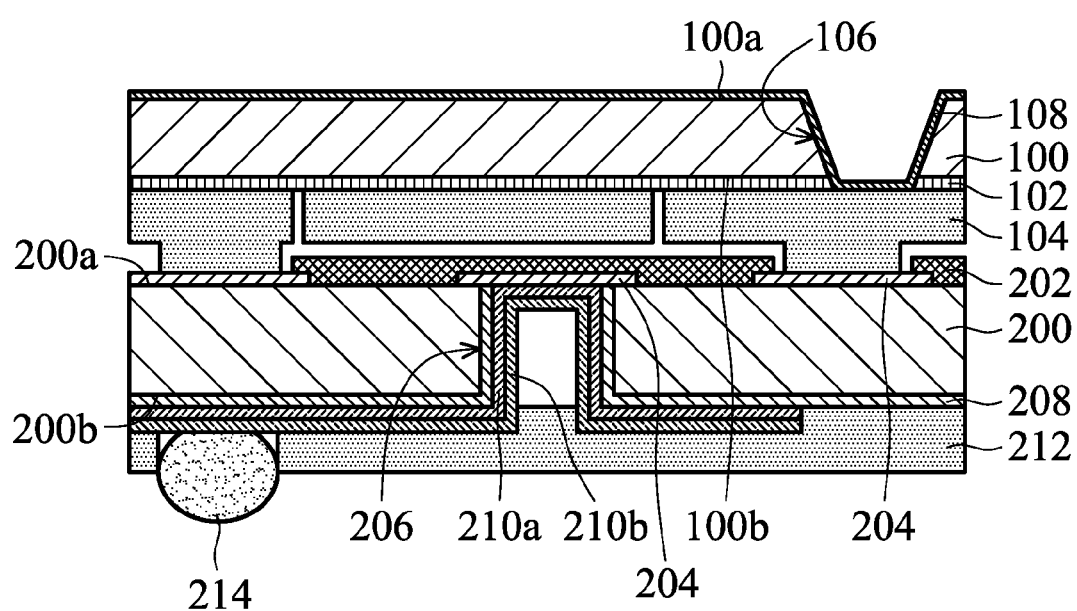
FIG. 2 is a cross-sectional view of a chip package according to an embodiment of the present invention.

FIG. 2 is a cross-sectional view of a chip package according to an embodiment of the present invention, wherein same or similar reference numbers are used to designate same or similar elements. The embodiment of FIG. 2 is substantially the same as the embodiment of FIG. 1, except that the adhesive layer 112 may be adhesive glue which is easily removed. Thus, the adhesive layer 112 and the carrier substrate 110 may be removed by, for example, exposure to light, heating and/or using solvents to reduce the size of chip packages.

In the present embodiment, the signal conducting structure 214 of the chip package may be disposed on the lower surface of the chip package, and the (grounding) pads 204 may be electrically connected to the conducting layer 108 located on the chip package through the lower semiconductor layer 104. Thus, the distribution density of the conductive bumps on the lower surface of the chip package may be reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
a first semiconductor substrate;
a second semiconductor substrate disposed on the first semiconductor substrate, wherein the second semiconductor substrate comprises a lower semiconductor layer, an upper semiconductor layer, and an insulating layer therebetween, and a portion of the lower semiconductor layer electrically contacts with at least one pad on the first semiconductor substrate;
a signal conducting structure disposed on a lower surface of the first semiconductor substrate, wherein the signal conducting structure is electrically connected to a signal pad on the first semiconductor substrate; and
a conducting layer disposed on and extending over an upper surface of the upper semiconductor layer of the second semiconductor substrate and electrically connected to the portion of the lower semiconductor layer electrically contacting with the at least one pad on the first semiconductor substrate.

2. The chip package as claimed in claim 1, wherein the conducting layer substantially covers an upper surface of the upper semiconductor layer of the second semiconductor substrate completely.

3. The chip package as claimed in claim 1, further comprising:
a hole extending from an upper surface of the upper semiconductor layer of the second semiconductor substrate toward the lower semiconductor layer of the second semiconductor substrate, wherein the conducting layer extends into the hole to electrically contact with a portion of the lower semiconductor layer.

4. The chip package as claimed in claim 3, wherein the hole is aligned with one of the least one pad.

5. The chip package as claimed in claim 1, further comprising:
a second conducting layer electrically connecting the signal conducting structure and the signal pad.

6. The chip package as claimed in claim 5, further comprising:
a second hole extending from a lower surface of the first semiconductor substrate to the signal pad, wherein the second conducting layer extends into the second hole to electrically contact the signal pad, and a second insulating layer separates the second conducting layer from the first semiconductor substrate.

7. The chip package as claimed in claim 1, wherein the conducting layer directly contacts with the second semiconductor substrate.

8. The chip package as claimed in claim 1, further comprising:
a carrier substrate disposed on the second semiconductor substrate.

9. The chip package as claimed in claim 8, further comprising:
an adhesive layer disposed on the carrier substrate and the second semiconductor substrate.

10. The chip package as claimed in claim 1, wherein the first semiconductor substrate comprises a complementary metal-oxide semiconductor field effect transistor chip, and the second semiconductor substrate comprises a micro-electro mechanical system chip.

11. A method for forming a chip package, comprising:
providing a first semiconductor substrate;
providing a second semiconductor substrate comprising a lower semiconductor layer, an upper semiconductor layer, and an insulating layer therebetween;
bonding the second semiconductor substrate onto the first semiconductor substrate such that a portion of the lower semiconductor layer electrically contacts with at least one pad on the first semiconductor substrate;
forming a conducting layer on and extending over an upper surface of the upper semiconductor layer of the second semiconductor substrate, wherein the conducting layer is electrically connected to the portion of the lower semiconductor layer electrically contacting with the at least one pad on the first semiconductor substrate; and
forming a signal conducting structure on a lower surface of the first semiconductor substrate, wherein the signal conducting structure is electrically connected to a signal pad on the first semiconductor substrate.

12. The method for forming the chip package as claimed in claim 11, further comprising:
before forming the conducting layer, thinning the upper semiconductor layer.

13. The method for forming the chip package as claimed in claim 11, further comprising:
before forming the conducting layer, removing a portion of the upper semiconductor layer to form a hole extending toward the lower semiconductor layer, and then forming the conducting layer such that the conducting layer extends into the hole to electrically contact with a portion of the lower semiconductor layer.

14. The method for forming the chip package as claimed in claim 13, wherein the conducting layer substantially covers an upper surface of the upper semiconductor layer and a sidewall and a bottom of the hole completely.

15. The method for forming the chip package as claimed in claim 11, further comprising:
before forming the signal conducting structure, thinning the first semiconductor substrate.

16. The method for forming the chip package as claimed in claim 15, further comprising:
bonding a carrier substrate onto the second semiconductor substrate; and
thinning the first semiconductor substrate from the lower surface of the first semiconductor substrate by using the carrier substrate as a support.

17. The method for forming the chip package as claimed in claim 16, further comprising:
removing a portion of the first semiconductor substrate from the lower surface of the first semiconductor substrate to form a second hole exposing the signal pad;
forming a second insulating layer on the lower surface of the first semiconductor substrate and a sidewall of the second hole;
forming a second conducting layer on the lower surface of the first semiconductor substrate, wherein the second conducting layer extends into the second hole to electrically connect with the signal pad; and
forming the signal conducting structure on the second conducting layer on the lower surface of the first semiconductor substrate.

18. The method for forming the chip package as claimed in claim 17, further comprising:
forming a protection layer on the lower surface of the first semiconductor substrate, wherein the protection layer has at least one opening exposing the signal conducting structure.

19. The method for forming the chip package as claimed in claim 18, further comprising:

removing the carrier substrate.

20. The method for forming the chip package as claimed in claim 11, further comprising:

performing a cutting process on the first semiconductor substrate and the second semiconductor substrate to form a plurality of chip packages separated from each other.

* * * * *